United States Patent
Chen et al.

(10) Patent No.: US 7,504,339 B2
(45) Date of Patent: Mar. 17, 2009

(54) METHOD TO FORM SHALLOW TRENCH ISOLATION WITH ROUNDED UPPER CORNER FOR ADVANCED SEMICONDUCTOR CIRCUITS

(75) Inventors: Zhihao Chen, Plano, TX (US);
Freidoon Mehrad, Plano, TX (US);
Brian K. Kirkpatrick, Allen, TX (US);
Jeff A. White, Terrell, TX (US);
Edmund G. Russell, Frisco, TX (US);
Jon Holt, Plano, TX (US); Jason D. Mehigan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 316 days.

(21) Appl. No.: 11/142,483

(22) Filed: Jun. 1, 2005

(65) Prior Publication Data

US 2005/0208732 A1   Sep. 22, 2005

Related U.S. Application Data

(62) Division of application No. 10/691,843, filed on Oct. 23, 2003, now Pat. No. 6,917,093.
(60) Provisional application No. 60/504,094, filed on Sep. 19, 2003.

(51) Int. Cl.
*H01L 21/311*   (2006.01)
(52) U.S. Cl. ........................ 438/696; 438/700; 438/702; 438/705; 438/752; 438/787
(58) Field of Classification Search ................ 438/424, 438/439, 442–445, 449–452, 694–705, 745, 438/748, 752–753
See application file for complete search history.

(56) References Cited

U.S. PATENT DOCUMENTS 4,533,430 A * 8/1985 Bower ......................... 438/695

(Continued)

OTHER PUBLICATIONS

"Silicon Processing for the VLSI Era," Stanley Wolf, vol. 4: Deep-Submicron Process Technology, 2002, p. 446-452.

(Continued)

*Primary Examiner*—Matthew Smith
*Assistant Examiner*—Maliheh Malek
(74) *Attorney, Agent, or Firm*—Yingsheng Tung; Wade J. Brady, III; Frederick J. Telecky, Jr.

(57) ABSTRACT

A trench structure in a wafer of semiconductor material and the method of forming the trench structure are described. The trench structure is formed on a semiconductor wafer that has a top surface of slow oxidization rate—slower than that of other major crystallographic planes of the semiconductor material. The trench is etched into the semiconductor wafer. The trench has substantially vertical trench-sidewalls near the top surface, the vertical trench-sidewalls near the top surface containing crystallographic plane that oxidizes at a rate comparable to that of the top surface. An insulating layer is grown on the top surface and on the trench-sidewalls and on corners where sidewall surfaces approach the top surface, the insulating layer at the corners being substantially thicker than at the sidewall adjacent to the corners. The difference in the oxide thickness is due to the faster oxidizing planes exposed at the corners. Finally, the trench is filled with a dielectric material.

17 Claims, 2 Drawing Sheets

U.S. PATENT DOCUMENTS

| | | | | |
|---|---|---|---|---|
| 4,986,879 | A | 1/1991 | Lee | 156/649 |
| 5,248,350 | A | 9/1993 | Lee | 148/33.2 |
| 5,315,147 | A * | 5/1994 | Solomon | 257/448 |
| 5,393,692 | A | 2/1995 | Wu | 437/69 |
| 5,441,901 | A * | 8/1995 | Candelaria | 438/317 |
| 5,637,529 | A | 6/1997 | Jang et al. | 437/69 |
| 5,658,822 | A | 8/1997 | Wu et al. | 438/446 |
| 5,849,626 | A | 12/1998 | Song | 438/444 |
| 5,885,883 | A | 3/1999 | Park et al. | 438/435 |
| 5,910,018 | A | 6/1999 | Jang | 438/425 |
| 5,920,787 | A * | 7/1999 | Haskell et al. | 438/425 |
| 5,940,719 | A | 8/1999 | Jang et al. | 438/443 |
| 6,020,230 | A | 2/2000 | Wu | 438/222 |
| 6,027,985 | A | 2/2000 | Jang et al. | 438/443 |
| 6,074,932 | A | 6/2000 | Wu | 438/435 |
| 6,150,234 | A * | 11/2000 | Olsen | 438/424 |
| 6,284,625 | B1 | 9/2001 | Ishisuka et al. | 438/425 |
| 6,426,251 | B2 | 7/2002 | Bronner et al. | 438/242 |
| 6,482,715 | B2 | 11/2002 | Park et al. | 438/424 |
| 6,482,718 | B2 | 11/2002 | Shiozawa | 438/446 |
| 6,537,895 | B1 * | 3/2003 | Miller et al. | 438/427 |
| 6,566,207 | B2 | 5/2003 | Park | 438/296 |
| 6,566,273 | B2 | 5/2003 | Kudelka | 438/733 |
| 6,649,488 | B2 | 11/2003 | Lee et al. | 438/424 |
| 6,649,489 | B1 | 11/2003 | Chang et al. | 438/424 |
| 6,653,200 | B2 | 11/2003 | Olsen | 438/424 |
| 2001/0038113 | A1 | 11/2001 | Bronner et al. | 257/301 |
| 2002/0008080 | A1 * | 1/2002 | Song et al. | 216/51 |
| 2002/0063292 | A1 | 5/2002 | Armstrong et al. | 257/367 |
| 2003/0003759 | A1 | 1/2003 | Kudelka | 438/733 |
| 2003/0032299 | A1 * | 2/2003 | Ouellet | 438/719 |

OTHER PUBLICATIONS

"Choices & Challenges for Shallow Trench Isolation" Laura Peters, Semiconductor International, Apr. 1999, p. 69-76.

"Novel Corner Rounding Process for Shallow Trench Isolation utilizing MSTS (Micro-Structure Transformation of Silicon)" Matsuda et al, IEEE 1998, p. 137-140.

* cited by examiner

METHOD TO FORM SHALLOW TRENCH ISOLATION WITH ROUNDED UPPER CORNER FOR ADVANCED SEMICONDUCTOR CIRCUITS

This is a divisional application of application Ser. No. 10/691,843 filed Oct. 23, 2003 now U.S. Pat. No. 6,917,093 which claims priority under 35 USC 119 of provisional application Ser. No. 60/504,094 filed Sep. 19, 2003, the contents of which are herein incorporated by reference in its entirety.

BACKGROUND OF THE INVENTION

This invention relates to semiconductor processing, particularly to a shallow-trench-isolation structure and the method of forming a trench with rounded upper corners.

Modern integrated-circuit technology is capable of packing a large number of individual circuit-elements near the surface of a small silicon chip. The individual elements are connected according to the circuit design by metal lines. The metal lines are imbedded in a matrix of multiple layers of metal and dielectric material. Beneath the silicon-chip surface, the circuit-elements are isolated from each other by regions of silicon dioxide to prevent unwanted electrical current passage between the circuit-elements.

The silicon dioxide regions may be formed in two techniques well known in the art of semiconductor processing. The Local Oxidation of Silicon (LOCOS) process forms the dioxide regions by thermally oxidizing a portion of the chip surface not designated for active circuit devices; the Shallow Trench Isolation (STI) process forms the dioxide regions by removing silicon from a portion of the chip surface and refilling with silicon-dioxide material where the isolation is required.

Generally speaking, LOCOS is not suitable for integrated circuits that have critical dimension smaller than 0.25 μm because of the "bird's beak" effect that allows the thermally grown silicon-dioxide region to encroach into the adjacent area where active circuit elements are to be built and the stress-induced silicon defects associated with the thermal process. The successor to LOCOS is shallow trench isolation (STI).

In a STI structure, a relatively shallow trench is first etched into the silicon substrate, which is then refilled with an insulator material. Following a short thermal-oxidation step that forms a thin film of $SiO_2$ on the trench walls and a refilling step that deposits a $SiO_2$ film on the chip, the surface is planarized by CMP to complete the isolation structure.

Since the bird's beak is entirely eliminated in a STI structure, smaller isolation spacing between circuit elements is possible compared with a LOCOS structure. In addition, the field oxide in STI is fully recessed, offering the potential of a completely planar surface after the isolation-structure formation.

STI significantly shrinks the area needed to isolate circuit elements and it provides better planarity. From a processing point of view, however, the formation of a STI structure that fully realizes the advantages is a little more complicated. One of the challenges lie in providing void-free, seamless gap-fill by CVD and uniform planarization by CMP; another in providing properly rounded corners at the upper edges of the trench. In the current art, void-avoidance is accomplished by the combination of using a high-density-plasma CVD (HDP-CVD) process, which includes sputter-etching action, and forming trenches with slanted sidewalls.

DESCRIPTION OF THE PREFERRED EMBODIMENT

Before describing the invention, a brief description of the silicon crystal structure is in order.

Figure 1A:
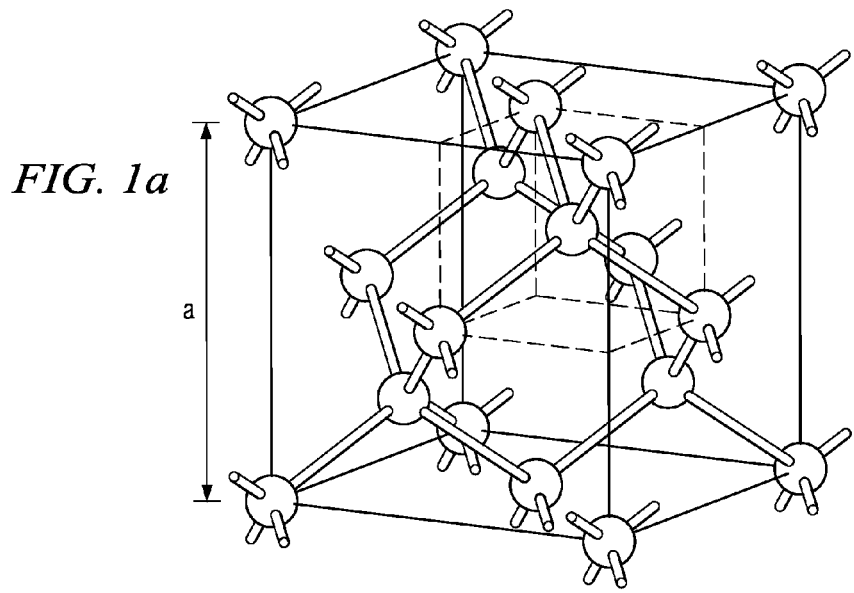
FIGS. 1a and 1b depict a unit cell of a diamond-structured crystal.

As shown in FIG. 1a, a silicon crystal is depicted in the form of its basic building block—a cubic unit cell that is approximately 5.43 Å per side at room temperature. In the art of crystallography, the silicon crystal is referred to as having a 'diamond' lattice structure, the unit building block of which can be viewed as two interpenetrating face-centered cubic lattices which are simply cubic blocks with silicon atoms at each of the eight corners and at the center of each of the six sides.

Once the crystal structure is ascertained, information on the crystallographic facets can also be determined. For example, as shown in 1a, the top side of the unit cell passes through five silicon atoms—four at the four corners and one in the middle. Since each corner-atom is shared by four neighboring sides if the unit cell is repeated in the x, y, and z directions, the density of silicon atoms on the top plane is two atoms per side of the unit cell. Different planes in the crystal may have different density of silicon atoms.

Crystallographers use Miller indices to identify the various crystal-facets or crystallographic planes in a crystal. The Miller index of a crystal plane is defined by the distance and orientation of the plane relative to a set of orthogonal axes and the point of origin.

Figure 1B:
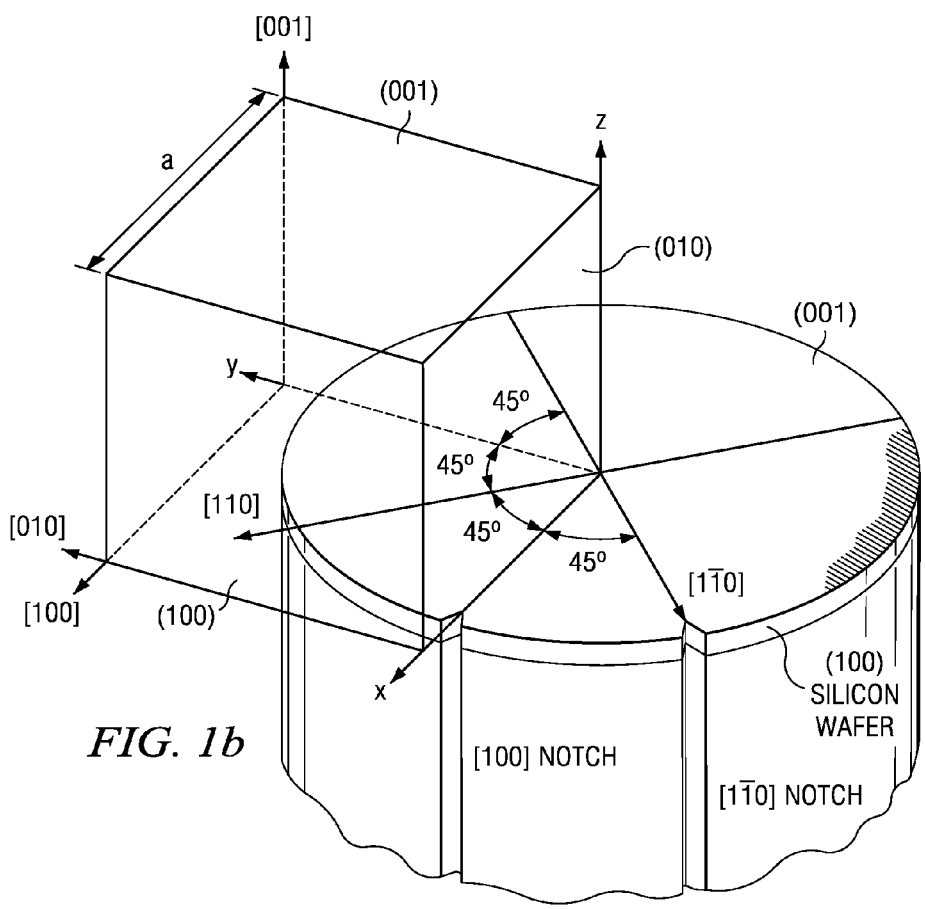

As shown in FIG. 1b, for example the top side of the unit cell has a Miller index of (001) because it runs parallel to the x and y axes and it intersects the z axis at a distance 'a' from the origin where 'a' is the length of the side of the cubic unit cell. According to the art, all planes that run parallel to this (001) plane and are distance 'a' from each other share the same Miller index (001). Planes that run parallel to the z and y axes and intersect the x-axis at integer intervals of 'a' are designated as the (100) planes and the plane that run parallel to the x and z axes and intersect the y-axis at intervals 'a' are designated as the (010) planes. And {100} designates a family of planes including the (100), (010), and (001) planes.

For the same token, a (100) plane defines a vector [100] that points perpendicularly away from the plane, and <100> designates a family of vectors including the [100], [010], and [001] vectors.

Figure 2:
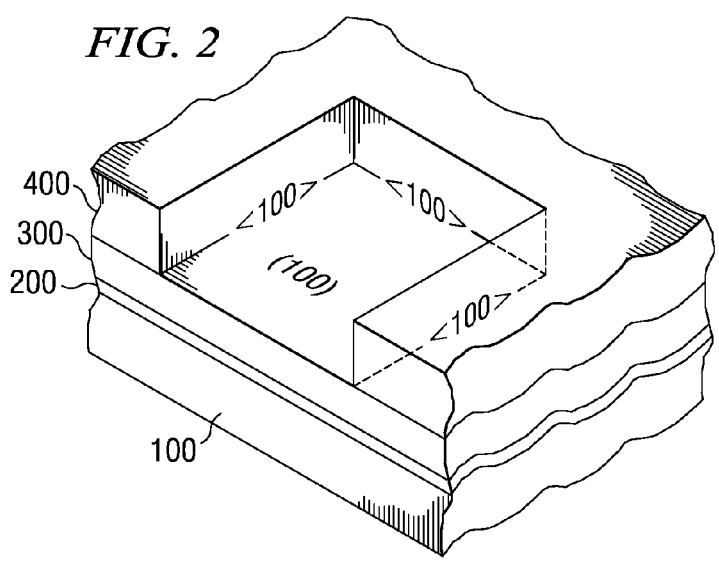
FIG. 2 depicts a section of a silicon-crystal ingot and a (001) surface, and a enlargement of a silicon unit cell.

The following embodiment can be better explained with the aids of Miller indices. According to one embodiment of the invention, a STI structure may be formed as follows:

As shown in FIG. 2, a pad-oxide layer 200 (about 100 Å) is formed on a (100) silicon wafer 100. The silicon wafer may be of single crystalline silicon or it may be a pre-stressed silicon wafer with silicon-germanium layer near the top surface of the wafer. The pad oxide layer is formed to reduce stress that would exist if a silicon nitride layer 300 (which is deposited next) were deposited directly on the silicon-wafer. In a single crystalline silicon wafer, such stresses could cause defects. In a pre-stressed wafer, the additional stresses could also disturb the pre-determined strain built-in by the silicon-germanium layer.

Also as shown in FIG. 2, a silicon-nitride layer 300 (about 1,200 Å) is deposited on the pad-oxide layer. The nitride layer 300 serves two roles:

a. as a hard mask for etching the trench; and
b. as a polish-stop-layer when the trench-fill dielectric material is planarized with a CMP process.

Also as shown in FIG. 2, photoresist 400 is applied and a STI mask is used to pattern the regions on the wafer surface where a STI trench will be formed. The trench-pattern puts the trench-edges along the <100> directions. The significance of the orientation will be explained in a later paragraph.

Figure 3:
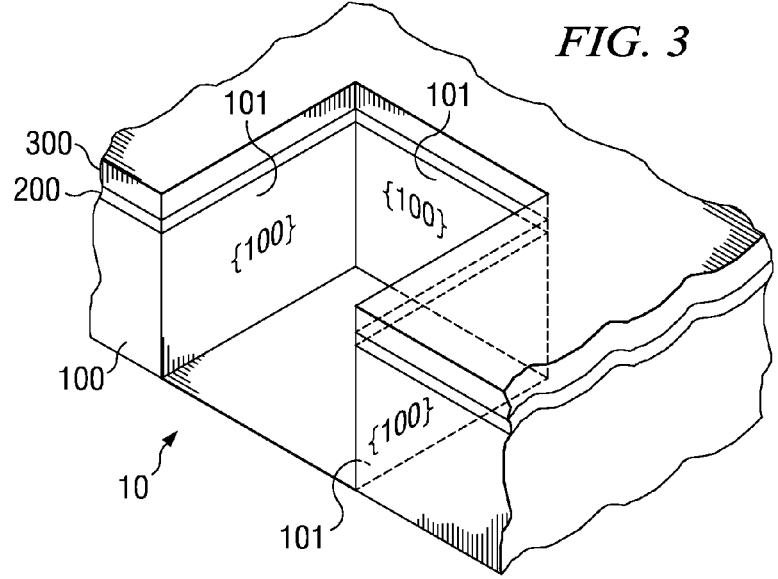
FIG. 3 depicts a cross section of a partially processed silicon trench.

As shown in FIG. 3, the nitride 300 and pad-oxide 200 are anisotropically etched, in a plasma-etching apparatus.

Also as shown in, FIG. 3, the trench 10 is etched. This silicon-etch step is carried out in a plasma-etching apparatus using a mixture of HBr and other gases. The sidewalls 101 (at least the upper portion near the pad oxide) of the trench 10 are etched nearly vertically (within about 10 degrees) to the top surface of the silicon wafer. The trench-etch process may be carried out in a second etcher, different from the one used to etch the nitride and oxide layers or it may be carried out in the same etcher. After the trench 10 is etched, the residual resist is stripped. Alternatively, the resist pattern 400 may be stripped from the top of the nitride layer 300 after the nitride-etch and before the silicon-etch process commences.

Figure 4:
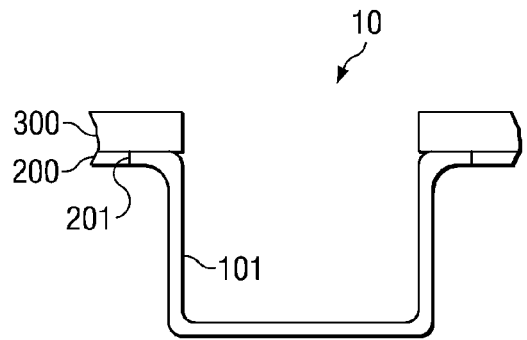
FIG. 4 depicts a cross section of a further processed silicon trench.

As shown in FIG. 4, a controlled recess 201 in the pad oxide 200 underneath the nitride layer 300 is formed with a short HF dip prior to an oxidation step that forms the liner-oxide layer 202. The liner-oxide layer 202 passivates the silicon surface 101 of the trench to provide a stable interface between the silicon and the trench fill material. The liner-oxidation process also helps rounding the top corner of the trenches 10 as will be explained in the next paragraph.

As shown in FIG. 3, the trench etching forms a sharp corner (between about 80 to 90 degrees) at the top of the trench. When a circuit element is built near such a sharp corner, the corner tends to enhance the local electric field. If the circuit element is a MOSFET, the locally enhanced electric field may cause undesirable effects, including degrading the transistor turn-off characteristics. Therefore, it is desirable that the top corner 102, as shown in FIG. 4, be rounded.

Figure 5:
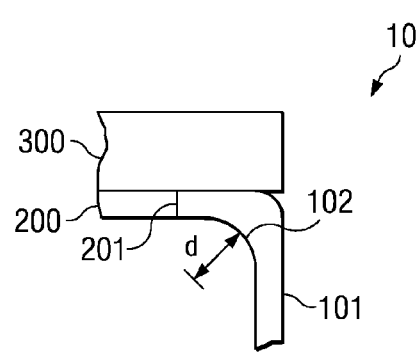
FIG. 5 depicts a cross section of a corner of a partially process silicon trench.

Also as shown in FIG. 5, the liner oxide 202 rounds the top corners 102 of the trench 10. The liner oxide 201 formed on the trench sidewalls 101 is 10-15-nm thick in this embodiment. The oxide at the upper corner 102 of the trench 10 should be about 1.5 times thicker to achieve good corner-rounding. Since the rate of oxide growth is a strong function of the orientation of the crystallographic surface exposing to the oxidation environment, the applicants recognize that one effective way to achieve desirable corner rounding is to form a trench of which the sidewalls near the upper corners are made of relatively slow-oxidizing crystallographic planes while faster oxidizing planes make up the corners. The applicants also recognize that among the major crystallographic planes, the {100} planes have the slowest rate of oxide growth. Major crystallographic planes mean those planes of which the Miller indices consist of low integer numbers such as 1, 2, or 3.

Therefore, it is desirable to pattern the trench in such a fashion that its edges align to the <100> directions (to within 10 degrees) and then etch the top portion of the trench anisotropically so that at least the sidewalls 101 near the upper corners are close to {100} planes. On the other hand, the crystallographic planes that make up the corners are necessarily of higher crystallographic indices and therefore faster oxidizing than the sidewalls. With such a configuration, the oxide film at the corners 102 is substantially thick than that at the sidewalls 101 and good corner rounding results.

The applicants also recognize that although the liner oxide may be formed by a rapid thermal oxidation (RTO) process, a furnace oxidation process in dry oxygen ambient with hydrogen chloride gas mixed therein produces a better oxide-to-silicon interface. The interface of a furnace-oxide, for example, has lower surface states density than the interface of RTO oxide.

In addition, for good oxide-thickness control, it is desirable to limit the oxidation-temperature to 900° C. or below so that the total furnace process-time stays in a reasonable range of about 20 minutes. Higher oxidation temperature may be used but the control of the oxide thickness is superior at a temperature of 900° C. or below.

One exemplary liner-oxidation process is as follows:

a. loading the wafer into the furnace at 700° C.;
b. ramping the furnace temperature to 850° C.;
c. providing a gaseous mixture of oxygen, trans-1,2 dichloethene (TRANS-LC® by SCHUMACHER) and nitrogen in the furnace while maintain the furnace-temperature at 850° C. for 25 minutes to grow a 80 Å-layer of liner-oxide on a (100) silicon wafer surface;
d. ramping the furnace-temperature down to 700° C.; and
e. unloading the wafer from the furnace at 700° C.

In as much as the present invention is subject to variations, modifications and changes in detail, it is intended that the subject matter discussed above and shown in the accompanying drawings be interpreted as illustrative and not in a limitation. For example, not all trenches in an integrated circuit chip need to be aligned to the same direction if other design considerations so dictate; the liner-oxide-growth process temperature and the gaseous mixture may vary if the thickness of the liner oxide deviates from that in the embodiment. The invention may also be applied to wafers of other orientations than (100) and to semiconductor other than silicon as long as a differentiation in oxidation rate exists between the trench-corners and the sidewalls near the corners.

What is claimed is:

1. A method of forming a shallow-trench-isolation structure in a silicon integrated-circuit wafer, comprising:

a. providing a silicon wafer having a (100) crystallographic top surface and a bottom surface;
b. providing a indicating means on the wafer of a [100] crystallographic direction;
c. forming an approximately 100 Å thick pad silicon-oxide layer on the top surface;
d. forming an approximately 1,200 Å thick silicon-nitride layer on the silicon-oxide layer;
e. forming a photo-resist layer on the silicon-nitride layer;
f. forming a shallow-trench-isolation (STI) pattern in the photo-resist layer, uncovering a portion of the top surface, the STI pattern having trench-edges aligned, within 10 degrees, to the <100> crystallographic directions of the silicon wafer;
g. etching a portion of the silicon-nitride layer uncovered by the STI pattern, uncovering a portion of the pad silicon-oxide layer;
h. etching the portion of the pad silicon-oxide layer uncovered by the nitride layer, uncovering a portion of the silicon wafer;
i. removing the photo-resist layer from the surface of the wafer;

j. etching the portion of the silicon wafer uncovered by the pad silicon-dioxide layer to form a trench with sidewalls, a portion of the sidewall near the top surface is within 15 degrees of being perpendicular to the top wafer-surface;

k. removing a portion of the pad oxide layer to uncover a portion of the silicon surface near the sidewall by dipping the wafer in dilute hydro-fluoric acid;

l. growing a silicon-dioxide-liner layer on the uncovered silicon top surface and on the trench-sidewalls and on corners where sidewall surfaces approach the top surface, the growth being in a oxidation furnace at about 850° C., the liner-oxide layer at the corner being over 50% thicker than at the sidewall adjacent to the corners; and m. filling the trench with silicon dioxide material.

2. The method of claim 1 in which the silicon wafer contains an approximately 20% germanium-doped silicon layer near the top surface.

3. A method of forming a trench structure in a wafer of semiconductor material, comprising:

a. providing a semiconductor wafer having a top surface that has an oxidization rate slower than that of other major crystallographic planes of the semiconductor material;

b. etching a portion of the wafer according to a trench pattern, forming substantially vertical trench-sidewalls near the top surface, the vertical trench-sidewalls near the top surface containing crystallographic plane that oxidizes at a rate comparable to that of the top surface; and c. growing an insulating layer on the top surface and on the trench-sidewalls and on corners where sidewall surfaces approach the top surface, the insulating layer at the corners being substantially thicker than at the sidewall adjacent to the corners; and d. filling the trench with a dielectric material.

4. The method of claim 3, in which the semiconductor is silicon.

5. The method of claim 4, in which the silicon contains a germanium doped layer near the top surface.

6. The method of claim 5, in which the concentration of the germanium dopant is about 20%.

7. The method of claim 4, in which the top surface contains a (100) crystallographic plane.

8. The method of claim 4, further comprising a pad oxide layer and a nitride layer on the wafer surface.

9. The method of claim 8, in which the pad oxide is approximately 100 Å thick and the nitride layer is approximately 1,200 Å thick.

10. The method of claim 4, in which the top portion of the sidewalls contain {100} planes.

11. The method of claim 4, in which the corners uncover crystallographic planes other than {100} planes.

12. The method of claim 4, in which the insulating material is silicon dioxide thermally grown on the sidewalls and the top surface.

13. The method of claim 12, in which the grown dioxide at the corners is at least 1.5 times thicker than the grown dioxide layer at the top portion of the sidewalls.

14. The method of claim 4, in which the growing of the insulating layer is at a temperature below 900° C.

15. The method of claim 4, in which the growing of the insulating layer is at approximately 850° C.

16. The method of claim 3, in which the trench pattern comprises a photo-resist pattern.

17. The method of claim 3, in which the sidewalls are within 10 degrees to vertical to the top surface.

* * * * *